United States Patent
He et al.

(10) Patent No.: US 7,382,810 B2
(45) Date of Patent: Jun. 3, 2008

(54) WIDELY-TUNABLE LASER APPARATUS

(75) Inventors: Gang He, Quebec (CA); Daniel Gariépy, Quebec (CA); Hongxin Chen, Quebec (CA); François Babin, Quebec (CA)

(73) Assignee: EXFO Electro-Optical Engineering, Inc., Quebec (CA)

( * ) Notice: Subject to any disclaimer, the term of this patent is extended or adjusted under 35 U.S.C. 154(b) by 0 days.

(21) Appl. No.: 11/652,634

(22) Filed: Jan. 12, 2007

(65) Prior Publication Data

US 2007/0165682 A1 Jul. 19, 2007

Related U.S. Application Data

(60) Provisional application No. 60/758,601, filed on Jan. 13, 2006.

(51) Int. Cl.
*H01S 3/10* (2006.01)
(52) U.S. Cl. .......................... 372/20; 372/94; 372/102; 372/23
(58) Field of Classification Search ................. 372/20, 372/23
See application file for complete search history.

(56) References Cited

U.S. PATENT DOCUMENTS 6,665,320 B1 * 12/2003 Arbore et al. ................ 372/20

2003/0193974 A1 * 10/2003 Frankel et al. ................ 372/20
2005/0035295 A1 2/2005 Bouma et al.

OTHER PUBLICATIONS

"S-, C- and L-Band Continuously Tunable Fiber Laser Using Thulium- and Erbium-Doped Fibers", by H. Chen, F. Babin, G. He and G.W. Schinn, Optical Society of America, Conferenc.
"Wide Tuning Range Wavelength-Swept Laser With Two Semiconductor Optical Amplifiers", by B. Bouma, et al, IEEE Photonics Technology Letters, vol. 17 No. 3, Mar. 2005.
Stitch-free widely-tunable dual-channel fibre laser for use in a passive component analyser, R. Baribault, H. Chen, G. He, F. Babin, G.W. Schinn, IEE Proc. Optoelectronics. V.

* cited by examiner

*Primary Examiner*—Dung T Nguyen
(74) *Attorney, Agent, or Firm*—Thomas Adams

(57) ABSTRACT

A widely-tunable laser apparatus comprises a plurality of tunable lasers having different ranges that overlap to encompass a desired operating range of wavelengths (for example from 1250 nm to 1650 nm) of the widely-tunable laser apparatus. The tunable lasers are tunable synchronously and selectively with their respective outputs connected in common to sweep the output of the widely-tunable laser apparatus substantially continuously over said operating range. The tunable lasers share the same tuning means which has a plurality of independent channels, each for light from a respective one of the tunable lasers.

10 Claims, 4 Drawing Sheets

WIDELY-TUNABLE LASER APPARATUS

CROSS-REFERENCE TO RELATED APPLICATIONS

The present claims priority from U.S. Provisional patent application No. 60/758,601 filed Jan. 13, 2006, the entire contents of which are incorporated herein by reference.

TECHNICAL FIELD

This invention relates to tunable lasers, especially tunable lasers that are tunable over a wide range of wavelengths.

BACKGROUND ART

In order to test components for Coarse Wavelength Division Multiplexing (CWDM) and Fiber-to-the-Home (FTTH) passive optical networks, including the characterization of wide-band couplers, and the measurement of single-mode-fiber attenuation, there is a need for a wideband tunable laser that can be "continuously swept" over the bands of wavelengths used in such networks, typically encompassing 1250 nm to 1650 nm, and exhibit stable (especially repeatable) laser output over the entire wavelength range. Such a widely-tunable laser apparatus having a single gain medium is not commercially viable at this time, since not only is there not yet a readily available gain chip capable of covering this full spectral range, but it is also very difficult to build a tunable filter (necessary in a laser cavity to enforce oscillation at a desired wavelength) that has a low, approximately uniform insertion loss and spectral passband for any selected central wavelength falling within such a large (~400 nm) range.

It is known, therefore, to use three or four conventional tunable external-cavity lasers, each tunable over a segment of the desired wavelength range (e.g. 1250 to 1650 nm) and select their respective outputs by means of a 1×N optical switch, switching from one to the next so as to cover the required wavelength range. An example of such a device is marketed by Santec Corporation as the Full-Band Tunable Laser TSL-210VF.

A disadvantage of such devices is that the output is not really continuous as the device is wavelength-swept throughout the entire range, because glitches or discontinuities occur at the transitions when the optical switch switches between the outputs of the different lasers.

There are two approaches for performing a swept wavelength measurement with this device. One is to stop the scan of a first one of the conventional external-cavity tunable lasers when its lasing wavelength attains a value where a second one of the conventional tunable external-cavity lasers is able to lase with at least as much power and signal-to-noise ratio. An optical switch is then used so that the light from the first tunable laser is blocked from being launched into the output fiber of the widely-tunable device and the light from the second tunable external-cavity laser is then launched into the same output fiber.

In order to avoid glitches or discontinuities in the wavelength when switching between respective outputs of two such lasers, their wavelengths must be synchronized to be substantially identical, within the limits of the desired wavelength resolution of the swept measurement, ultimately limited to approximately the linewidth of the laser emission. However, tunable external-cavity lasers typically exhibit a very narrow spectral output, which, even when artificially broadened using the "coherence control" feature offered with most commercial versions of these lasers, rarely can exceed an effective linewidth of more than 4 pm. The attainment of such a high degree of synchronization using two independent lasers can be difficult and prohibitively expensive. Moreover, this approach normally involves stopping the scan briefly during the measurement process, and leads to an abrupt change in the laser light intensity being output from the widely-tunable device as switching occurs. This prevents such a widely-tunable device from being used to perform rapid continuous scans across the full, say, 1250-1650 nm spectral range.

The second approach involves optically combining, via a coupler or splitter, the outputs from the constituent external-cavity lasers of the widely-tunable device. In this way, there can be, in principle, a smooth transition between the emission of one of the external-cavity lasers to the other as the widely-tunable device is scanned. However, the synchronization of the wavelength is even more difficult than in the "switched-output" case above, as the synchronization must be nearly perfect (i.e. to within the limits of the desired wavelength resolution of the swept measurement) not just at one wavelength in the region where the optical outputs of the adjacent tunable external-cavity lasers overlap, but at all wavelengths in a range of wavelengths (typically 5-20 nm) corresponding to the overlap between the lasing ranges of the two lasers. Again, such synchronization is not commercially available or would be prohibitively expensive.

It has been proposed to combine two cavity lasers with a single, shared tuning device to form a tunable laser apparatus with a tunable range that is approximately equal to the sum of the tuning ranges of the two cavity lasers. Three of the present inventors, and a colleague, disclosed such a widely-tunable laser apparatus in the paper "S-, C- and L-Band Continuously Tunable Fiber Laser Using Thulium- and Erbium-Doped Fibers", by H. Chen, F. Babin, G. He and G. W. Schinn, Optical Society of America, Conference of Lasers and Electro-optics 2005, Baltimore, May 2005, the contents of which are incorporated herein by reference. The laser illustrated in FIG. 1 of that paper comprises a TDF laser and an EDF laser whose rings are conjoined by two circulators so that a tunable bandpass filter between the two circulators is shared by both rings. Light from the EDF laser propagates through the tunable bandpass filter in one direction and the light from the TDF laser passes through the tunable bandpass filter in the opposite direction.

A somewhat similar approach is disclosed by B. Bouma et al. in United States published patent application No. 2005/0035295 and their paper Wide Tuning Range Wavelength-Swept Laser With Two Semiconductor Optical Amplifiers, IEEE Photonics Technology Letters, Vol. 17 No. 3, March 2005, the contents of both of which are incorporated herein by reference. Their widely-tunable laser apparatus also uses optical circulators to couple a single tunable filter, specifically a diffraction grating and rotatable polygonal mirror, in a common portion of the rings of two cavity lasers.

A disadvantage of both such widely-tunable laser apparatus, however, is that the insertion loss attributable to the circulators limits the useful tuning range of each of the tunable lasers comprising the widely-tunable laser apparatus. This limitation is a consequence of the fact that, in a cavity, the condition that loss is not greater than gain must hold at each wavelength for which lasing action is to occur. Since the gain as a function of wavelength of a given gain medium necessarily falls off as the difference between the desired lasing wavelength and the wavelength corresponding to the gain peak is increased, the ultimate tuning range of the tunable laser may be significantly reduced as the cavity loss is increased. Moreover, it is frequently the case that the insertion loss of a circulator also increases at wavelengths near the extremes of its operating window, thereby further reducing the attainable tuning range of the tunable laser. As a consequence, a widely-tunable laser apparatus based on constituent tunable lasers using circulators in their cavities would need to be comprised of a greater number of tunable lasers to cover a wide spectral range, e.g. 1250-1650 nm, thereby increasing the overall cost and design complexity. There is a need, therefore, for a widely-tunable laser apparatus design, based on tunable lasers, that does not require the use of circulators and minimizes the cavity loss.

SUMMARY OF THE INVENTION

The present invention seeks to eliminate, or at least mitigate, the disadvantages of known widely-tunable laser apparatus, or at least provide an alternative.

According to the present invention there is provided a widely-tunable laser apparatus comprising a plurality of tunable lasers having different wavelength ranges and their respective outputs connected in common to an output port of the widely-tunable laser apparatus, the plurality of tunable lasers comprising a plurality of gain media, respectively, and common tuning means operable to tune the respective output wavelengths of the plurality of tunable lasers synchronously so as to vary the wavelength of laser light leaving the common output port substantially continuously over a range of wavelengths greater than any individual one of the wavelength ranges of the tunable lasers, the common tuning means having a plurality of distinct channels, each for light from a respective one of the tunable lasers.

The tuning means may comprise a tunable bandpass filter. The light from each gain medium may be conveyed to the tunable bandpass filter by way of an input port that is spaced from a corresponding output port which receives a portion of the corresponding diffracted light.

In preferred embodiments of the invention, the tuning means comprises dispersion means, for example a diffraction grating, a plurality of input ports each for directing light from a respective one of the gain media onto the dispersion means and a corresponding plurality of output ports each for selecting a portion of the diffracted light from a respective one of the input ports, the plurality of channels being defined by distinct paths respectively, each between a respective one of the input ports and a corresponding one of the output ports, the arrangement being such that, as the tuning means is tuned, the plurality of output ports select light having substantially the same wavelength.

In the context of this patent specification, the term "moderate-coherence" is intended to cover a range of (in-fiber) laser coherence lengths well suited for most test and measurement applications, i.e. falling between about 5 cm (i.e. longer than most devices under test) and about 2 m in length (i.e. generally shorter than the distance between reflective events—such as connectors) on most cables that may be connected to the DUT). An in-fiber coherence length of 5 cm corresponds to a 3-dB linewidth in optical frequency units of approximately 8 GHz, whereas a coherence length of 2 m corresponds to a linewidth of approximately 200 MHz.

Preferably, each moderate coherence laser comprises a "multi-longitudinal mode" laser, i.e. a laser having an effective output linewidth defined by the envelope of many (typically >50) oscillating laser modes.

In preferred embodiments, each of the tunable lasers comprises a ring cavity laser having a gain medium, an isolator and a splitter coupled in series with a respective one of the channels of the tunable filter to form the ring.

Preferably, the insertion loss for each individual filter channel is optimized for the wavelength range corresponding to the (individual) gain medium of the tunable laser used with that channel.

Where the tunable bandpass filter comprises a grating and a retroreflector, for example a roof mirror, the plurality of input port and output port pairs may define a plurality of parallel paths such that light from a respective one of the tunable lasers entering via one input port is diffracted, retroreflected and diffracted again, to leave via the corresponding output port.

The desired operating range of wavelengths preferably encompasses the O, E, S, C, L and U bands used in optical communications.

The foregoing and other objects, features, aspects and advantages of the present invention will become more apparent from the following detailed description, in conjunction with the accompanying drawings, of preferred embodiments of the invention which are described by way of example only.

DESCRIPTION OF THE PREFERRED EMBODIMENTS

Figure 1:
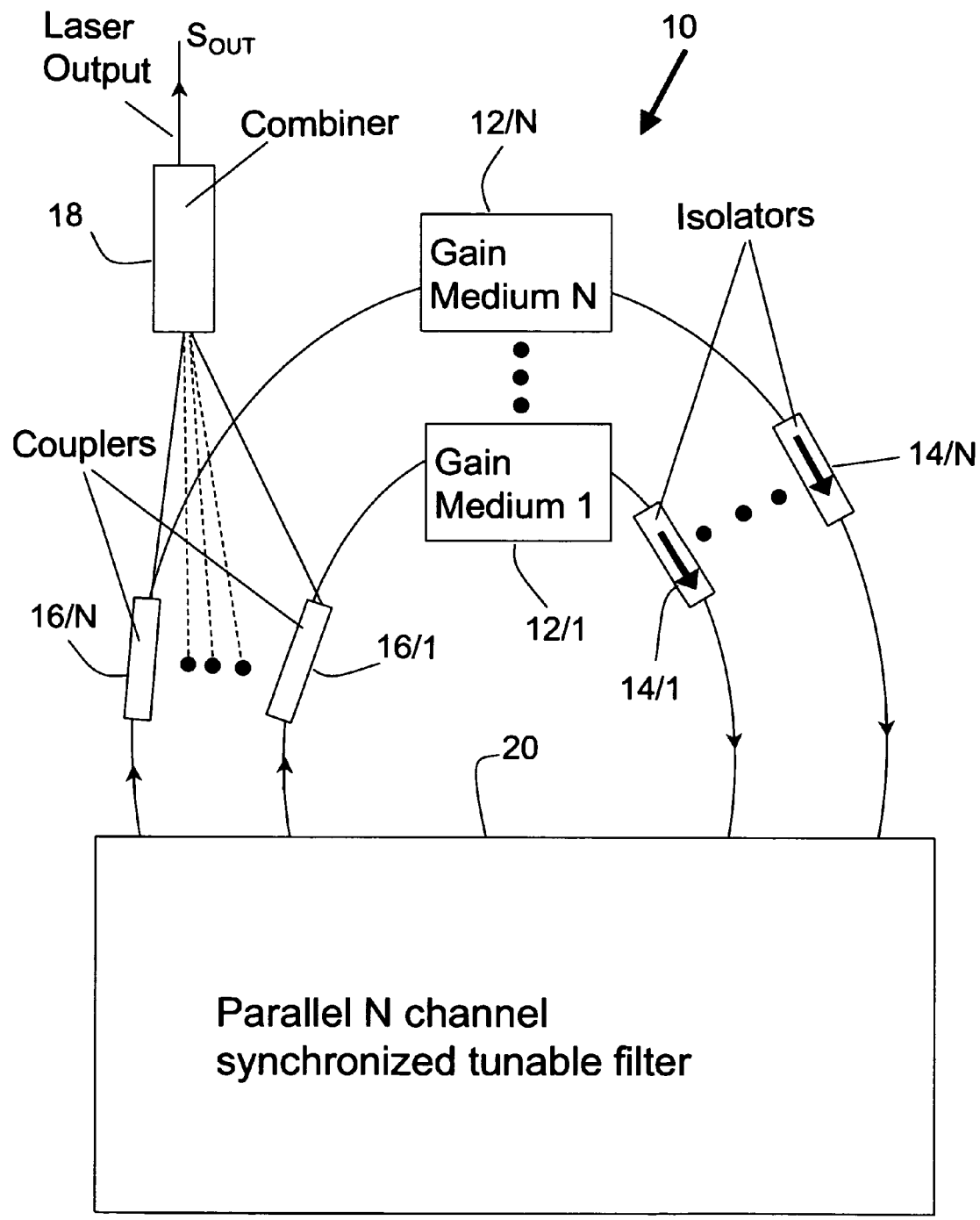
FIG. 1 is a schematic diagram of a widely (wavelength) tunable laser apparatus comprising N tunable lasers tuned by an N-channel tunable filter.

Referring to FIG. 1, a widely (wavelength) tunable laser apparatus 10 comprises a plurality N of tunable lasers, specifically tunable ring cavity lasers. For ease of depiction, only two of the ring cavity lasers are shown. The ring cavity lasers comprise, respectively, gain media 12/1 to 12/N, for example semiconductor optical amplifiers (SOAs), isolators 14/1 to 14/N (to ensure unidirectional, traveling-wave lasing), and couplers(splitters) 16/1 to 16/N, each for extracting signals from the respective one of the lasers and conveying them to a combiner/splitter 18 which combines the outputs of all of the lasers to provide a common laser output signal SOUT which is widely tunable. The actual tuning range of the widely-tunable laser apparatus 10 will depend upon the individual tuning ranges of the N tunable lasers. For passive optical communications network components using single-mode fiber, the overall range typically will be from about 1250 nm to about 1650 nm.

Each of the SOAs 12/1 to 12/N exhibits gain across a different part of the optical spectrum, with a small (typically 10-20 nm) overlapping region where SOAs with adjacent ranges both exhibit sufficient gain to maintain laser oscillation in their respective ring cavities. An N-channel synchronized tunable filter 20 is shared by all of the N ring cavities, being coupled to the respective outputs of isolators 14/1 to 14/N and respective inputs of the couplers 16/1 to 16/N, by polarization-maintaining (PM) optical fibers, to form the rings. It should be noted, however, the N ring cavities are optically independent from each other, i.e., little or no light from one cavity leaks into the others.

The combiner 18 can be either a coupler with a given splitting/combining ratio (e.g., a 50/50 ratio if only two ring cavities are used, i.e., N=2), or a WDM coupler, or a combination of the two. Generally, if N>2, a combination is preferred.

The widely-tunable laser apparatus 10 operates in a multi-longitudinal mode condition. The effective spectral width (or linewidth) depends on the bandwidth of tunable filter 20, the cavity length and the characteristics of SOAs 12/1 to 12/2 under conditions of saturated gain (e.g. non-linear effects, etc.).

Figure 2:
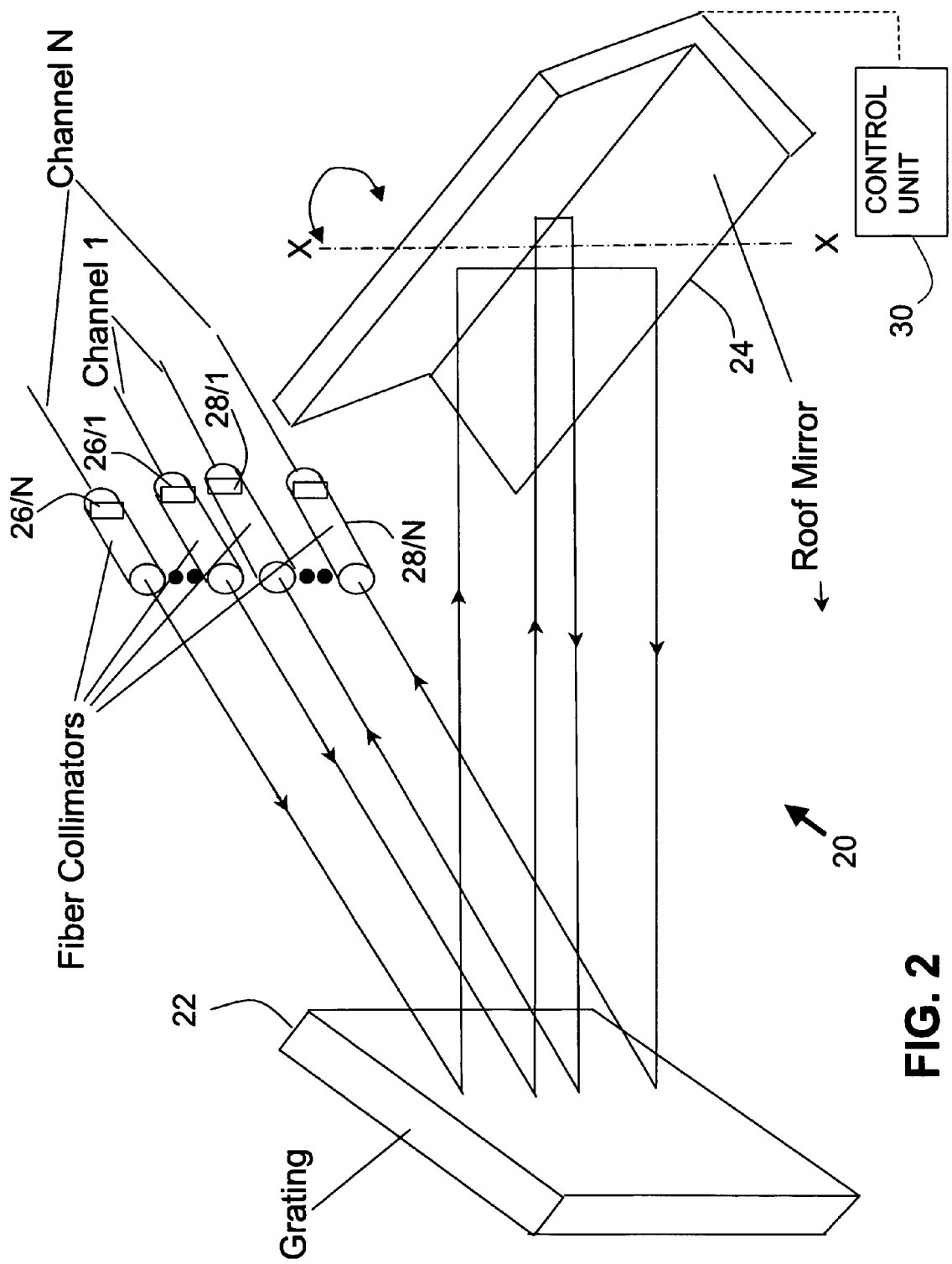
FIG. 2 is a schematic perspective view of the tuning unit of FIG. 1.

A suitable N-channel synchronized (wavelength) tunable filter 20 having a bandwidth of about 100 pm or less (but much more than the intermodal spacing of a typical 10 m-long ring cavity of approximately 20 MHz, i.e., much greater than about 0.2 pm), is shown in more detail in FIG. 2, in which two beam paths are depicted for the case where the filter is tuned for maximum transmission of light at a particular wavelength $\lambda$. Again, only these two channels are shown for ease of depiction. The tunable filter 20 comprises, in effect, two diffraction grating-based monochromators synchronized so as to obtain "continuous tuning capacity" over the whole wavelength range (i.e., 1250 to 1650 nm). Typically, the overall tuning range will encompass the O, E, S, C, L and U bands used in optical communications.

Thus, tunable filter 20 comprises a diffraction grating 22, roof mirror 24, a set of input fiber collimators 26/1 to 26/N and a set of output fiber collimators 28/1 to 28/N. Light from the first ring cavity, specifically from isolator 14/1 (FIG. 1), enters the monochromator via input fiber collimator 26/1 which collimates it and directs the collimated light onto the diffraction grating 22. Following reflection by the grating 22, the light is reflected by roof mirror 24 and returns to the diffraction grating 22 by a parallel path that lies in a different, parallel diffraction plane of the grating 22 (downwards in FIG. 2). After diffraction a second time by the grating 22, the light leaves the tunable filter 20 via output fiber collimator 28/1, whereupon output coupler 16/1 extracts a portion for combination by combiner 18. The light from the ring cavity N enters the tunable filter 20 via input fiber collimator 26/N and follows a similar path though the tunable filter 20 to emerge via output fiber collimator 28/N, and a portion is extracted by output coupler 16/N and is subsequently combined with the aforementioned portion from output coupler 16/1 by means of the combiner 18.

It should be appreciated that the positions of isolators 14/1, 14/N in their respective cavities need not be just before the tunable filter 20, but this position is preferred since it minimizes possible backreflections into the gain media 12/1, 12/N respectively, as well as ensuring that the lasing action is unidirectional in the respective ring cavities.

The N ring cavity lasers are tuned synchronously by means of a control unit 30 which rotates the roof mirror 24 about an axis X-X perpendicular to the 2N diffraction planes, each of which corresponds to a respective one of the light beams incident upon the diffraction grating during the first pass and the light beams from the diffraction grating reaching the output ports following the second pass. The channels 1-N are tuned synchronously because the common grating 22 and roof mirror 24 are shared by all of the channels 1-N and all of the input beams and all of the output beams, respectively, are parallel.

In operation of the widely-tunable laser apparatus 10, each of the light beams directed from the input ports 26/1 to 26/N will be diffracted into a "fan" of light according to wavelength. Rotation of the retroreflector determines which portion of the "fan" of light emerges from the corresponding output port. The spread (i.e. the dispersion) of the fan and that portion of the fan that is coupled out of the corresponding one of the output ports 28/1 to 28/N determines the passband and central wavelength of the filter. The filter passband, combined with the gain of the gain medium, and the output coupling ratio of coupler 16/1 then largely determine the effective linewidth of the ring laser. When lasing action occurs, essentially all the energy from the gain medium will be used to generate a light beam at the selected wavelength, transforming the "fan" of light into a monochromatic beam.

Figure 4:
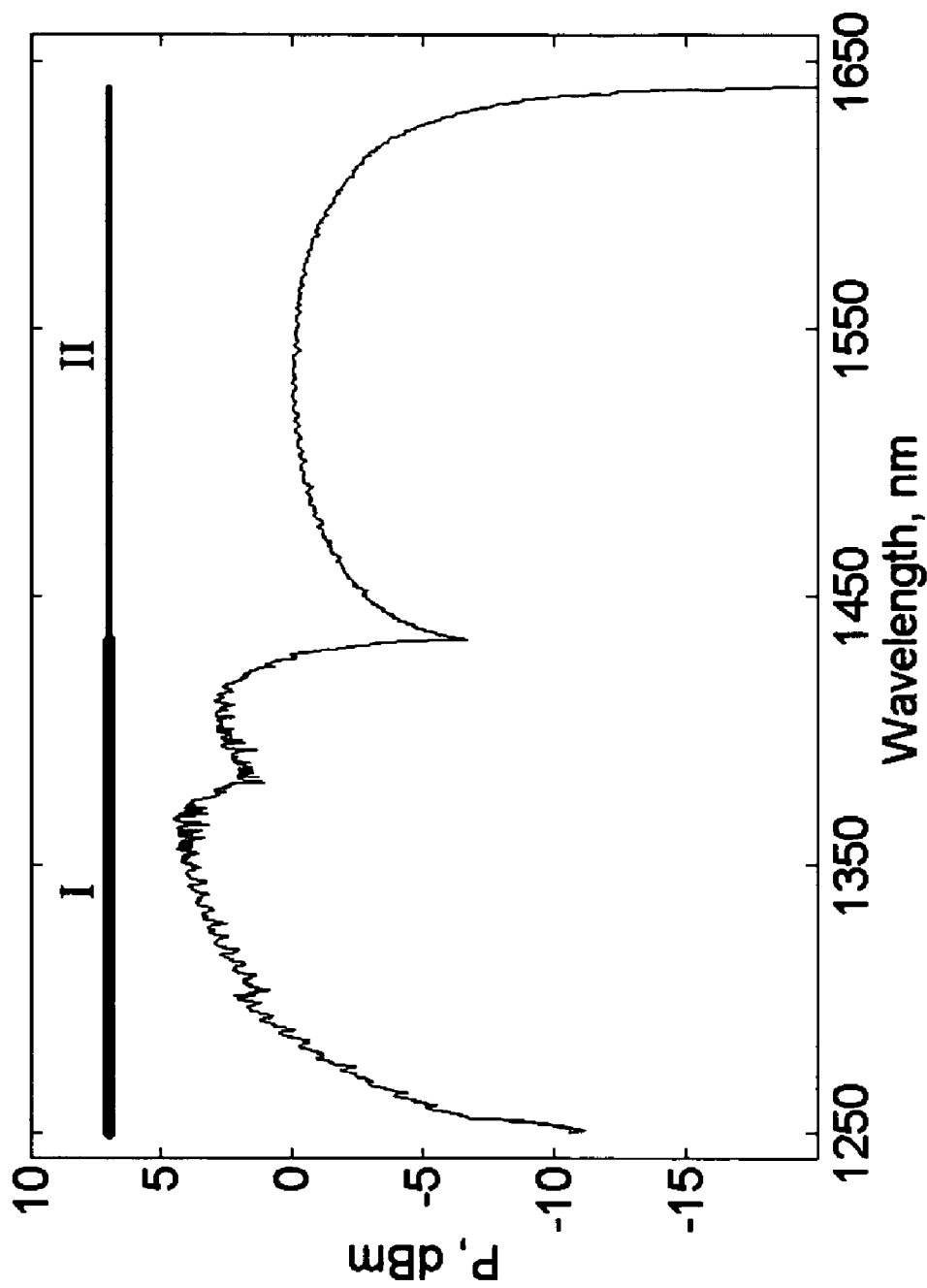
FIG. 4 is a graph of output power against wavelength for a widely-tunable laser apparatus having two lasers.

It is envisaged that, generally, all of the lasers will be switched on at all times, but each laser will only supply light over its own normal operating range of wavelengths. As illustrated in FIG. 4, which illustrates output power with respect to wavelength for a widely-tunable laser apparatus 10 having only two lasers, at wavelengths from about 1250 nm to about 1440 nm (band I), only the first laser (gain medium 12/1) is providing light. For wavelengths from about 1450 nm to about 1640 nm (band II), only the second laser (gain medium 12/N) is providing light. Over a small "overlap" range from about 1430 nm to about 1450 nm, both lasers will provide light. When the filter is scanned past the region where a particular SOA has gain, it will simply emit broadband ASE (amplified spontaneous emission), but not with any significant spectral power at wavelengths far from where its gain is optimized.

Referring to FIG. 2, the output ports 28/1 to 28/N are so positioned relative to the diffraction grating 22 that, as the retroreflector is rotated, the portions of their respective "fan" light reaching the corresponding output ports will have the same wavelength. This wavelength-synchronization and loss minimization procedure is straightforward. First, the parallelism of the input beams can be verified and, if necessary, optimized by a simple auto-collimating process whereby a plane mirror in placed in front of the input ports 26/1, 26/N and the back-reflected power into each of the input ports is maximized by angularly adjusting the collimators 26/1 to 26/N. Second, light from a narrow-band laser such as a DFB, preferably at a wavelength near the middle of the desired ultimate tuning range (e.g. 1450 nm for a widely-tunable laser apparatus from 1250-1650 nm using two SOAs), is launched simultaneously via a suitable splitter into both of the input ports. The roof mirror 24 is rotated to maximize the measured output power through each of the output ports 28/1, 28/N, and then the output ports are adjusted angularly and laterally to maximize the output power. All of the input and output ports are then suitably fixed into place (e.g. with epoxy glue).

It should be noted that the fiber collimators corresponding to different channels (e.g. 26/1, 28/1 vs. 26/N, 28/N) are generally not identical, but have been previously optimized for operation in their respective wavelengths ranges (e.g. optimized for minimum loss at 1350 and 1550 nm, respectively).

For the practical embodiment with two ring cavities, whose power output is depicted in FIG. 4, the Full-Width Half-Maximum (FWHM) or 3-dB linewidth of each of the lasers 12/1, 12/N is about 0.07 nm (70 pm) and wavelength synchronization is better than 5 pm, at least in the range where the outputs of the two lasers overlapped spectrally.

Figure 3:
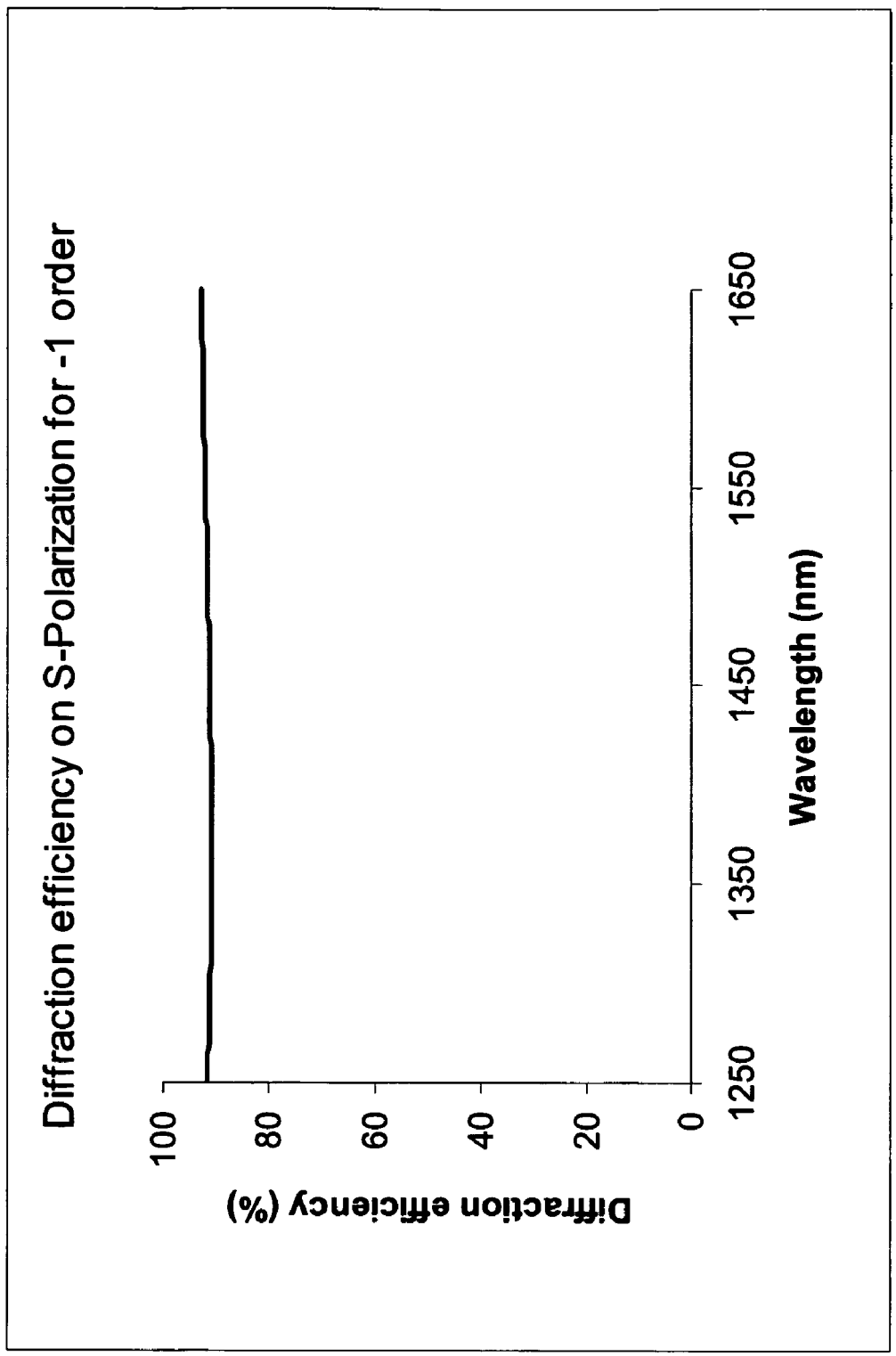
FIG. 3 is a graph of diffraction efficiency of S-polarization against wavelength for a holographic reflection grating with 1050 lines/mm at an angle of incidence of 75 degrees.

A high resolution reflection grating 22 with 1050 lines/mm working in "grazing incidence" conditions yielded very high diffraction efficiency (more than 90%) for S-polarization of the incident light beam over a wide wavelength range, as illustrated in FIG. 3, and provided very high wavelength dispersion of the output, which contributed to the advantages of low loss, narrow band and compactness. It should be appreciated that the grazing angle need not be the same for both input and output light, although it is preferable to have the same grazing angle, say about 80 degrees.

The use of polarization-maintaining (PM) fibers to connect the polarization-dependent SOAs 16/1 to 16/N to the tunable filter 18 (to build the ring cavities) helps to make the widely-tunable laser apparatus 10 robust to environmental perturbations such as vibration, temperature changes, etc., and avoids the need to employ intra-cavity polarization controllers.

The splitting ratios of the couplers 16/1 to 16/N, respectively, need not be equal. In fact, their ratios may be selected according to the desired tuning ranges of the tunable lasers and the respective inherent gains of the gain media. Typically, the ratio might be such that 75 per cent of the light remains in the laser cavity.

In the practical embodiment, the full wavelength range generally of interest for telecommunications, from 1250 nm to 1650 nm, was covered by two gain media, one having a central wavelength around 1350 nm and the other having a central wavelength around 1530 nm. Both gain media had 3-dB gain bandwidth more than 70 nm. Suitable gain media, i.e., SOAs 16/1 to 16/N, are the BOA-Series of gain chips marketed by Covega Corporation of Jessup, Md., U.S.A.

Various modifications to the above-described embodiment are possible within the scope of the present invention. For example, the control unit 30 could rotate the diffraction grating 22 instead of the roof mirror 24. Also, an alternative retroreflector, for example a right-angled prism, could be used instead of the roof mirror 24. Each of the polarization-maintaining fibers could be replaced by a single mode fiber with suitable polarization controllers inside the cavity. The grating could have between 900 lines/mm and 1200 lines/mm. The incident (grazing) angles of the incident light beams and diffracted light beams, respectively, might be in the range from about 70 to about 85 degrees.

It should also be appreciated that the ring cavities could be replaced by linear cavities.

Also, the reflective diffraction grating 22 could be replaced by a transmission grating with appropriate relocation of the output ports.

It is also envisaged that each pair of ports comprising an input port and an output port could be offset in a direction parallel to the plane of diffraction rather than perpendicular to it.

The variation in output power illustrated in FIG. 4 is tolerable for widely-tunable laser apparatus used to test passive optical network components because, as a general rule, the insertion loss of the device-under-test is obtained by simultaneously measuring the power entering and leaving the device-under-test and determining the difference. If desired, however, better spectral uniformity of the output power level could be obtained by employing more lasers and/or by controlling the gain medium of each of the lasers, possibly by means of a feedback loop.

The following advantageous aspects of widely-tunable laser apparatus embodying the present invention render them especially applicable to the testing of passive optical components and networks:

1) A ring cavity with an optical isolator (creating thereby a "traveling wave cavity") is used for each of the constituent lasers of the composite source, which yields higher power and a wider tuning range than a linear cavity (or standing wave cavity) laser using the same given gain medium.

2) The "grating multi-pass filter" design with its synchronized multi-channel configuration has advantages in terms of low loss, narrow passband in a compact volume, robustness and flexibility, making it a key element for combining multiple gain media and cavities to build a laser apparatus capable of being swept continuously over a very wide wavelength range.

3) Because the channels of the tuning means, specifically the tunable filter 20, corresponding to the different gain media are distinct and each channel has a separate input and output port, interchannel crosstalk is not a problem and no circulators are needed. Also, the optical elements of each individual channel can be adjusted to minimize the channel insertion loss for the wavelength range of the corresponding (individual) gain medium, whose gain covers a wavelength range less than the operating wavelength range of the widely-tunable laser apparatus 10. In this way, the widely-tunable laser apparatus 10 may have a wider operating wavelength region, since the loss is independently optimized in the cavity of each of its constituent ring-cavity lasers.

4) The "multi-longitudinal mode approach" does not require synchronization between wavelength and cavity length (unlike that required for a conventional single (longitudinal) mode external cavity tunable laser source), because a multi-longitudinal mode laser can be considered as always oscillating on multiple longitudinal modes; hence there is little difference in the effective linewidth; nor are there sudden jumps in the effective peak wavelength or output power as the laser is tuned.

5) Another advantage of the "multi-longitudinal mode laser approach" for passive component testing and measurement is the low coherence noise for high precision measurement, which is especially important for measurement of polarization dependent loss (PDL) and Optical Return Loss (ORL)—i.e., back reflection.

For more-detailed information about embodiments of the present invention, the reader is directed to the article "Stitch-free widely-tunable dual-channel fibre laser for use in a passive component analyser", R. Baribault, H. Chen, G. He, F. Babin, G. W. Schinn, IEE Proc. Optoelectronics, Vol. 153, October 2006, pp. 262-267, the contents of which are incorporated herein by reference.

INDUSTRIAL APPLICABILITY

Advantageously, embodiments of the present invention have a simple structure and are robust, compact and inexpensive as compared with known tunable lasers for use in testing components of CWDM and FTTH networks.

Although embodiments of the invention have been described and illustrated in detail, it is to be clearly understood that the same are by way of illustration and example only and not to be taken by way of the limitation, the scope of the present invention being limited only by the appended claims.

What is claimed is:

1. A widely-tunable laser apparatus comprising a plurality of tunable lasers having different wavelength ranges and their respective outputs connected in common to an output port of the widely-tunable laser apparatus, the plurality of tunable lasers comprising a plurality of gain media, respectively, and common tuning means operable to tune the respective output wavelengths of the plurality of tunable lasers synchronously so as to vary the wavelength of laser light leaving the common output port substantially continuously over a range of wavelengths greater than any individual one of the wavelength ranges of the tunable lasers, the common tuning means having a plurality of distinct channels, each for light from a respective one of the tunable lasers.

2. A widely-tunable laser apparatus according to claim 1, wherein each of the tunable lasers comprises a ring cavity laser having a gain medium, an isolator and a splitter coupled in series with the tuning means to form a ring.

3. A widely-tunable laser apparatus according to claim 1, wherein the tuning means comprises a tunable bandpass filter.

4. A widely-tunable laser apparatus according to claim 2, wherein the tuning means comprises a tunable bandpass filter.

5. A widely-tunable laser apparatus according to claim 1, wherein the tuning means comprises a dispersion device, a plurality of input ports for directing light from a respective one of the lasers onto the dispersion device and a corresponding plurality of mutually-spaced output ports each for selecting a portion of the light from a respective one of the input ports after dispersion thereof, the distinct channels each being defined by a separate paths between a respective one of the input ports and a corresponding one of the output ports, the arrangement being such that, as the tuning means is tuned, the plurality of output ports select light having substantially the same wavelength.

6. A widely-tunable laser apparatus according to claim 2, wherein the tuning means comprises a dispersion device, a plurality of input ports for directing light from a respective one of the lasers onto the dispersion device and a corresponding plurality of mutually-spaced output ports each for selecting a portion of the light from a respective one of the input ports after dispersion thereof, the distinct channels each being defined by a separate paths between a respective one of the input ports and a corresponding one of the output ports, the arrangement being such that, as the tuning means is tuned, the plurality of output ports select light having substantially the same wavelength.

7. A widely-tunable laser apparatus according to claim 1, wherein the tuning means comprises a diffraction grating.

8. A widely-tunable laser apparatus according to claim 1, wherein said range of wavelengths encompasses the O, E, S, C, L and U bands used in optical communications.

9. A widely-tunable laser apparatus according to claim 1, wherein each of the tunable lasers is configured to provide a moderate coherence output.

10. A widely-tunable laser apparatus according to claim 9, wherein at least one of the tunable lasers provides its said moderate coherence output with a linewidth in optical frequency units in the range from approximately 200 MHz to approximately 8 GHz.

* * * * *